(12) United States Patent
Lee

(10) Patent No.: US 8,211,769 B2
(45) Date of Patent: Jul. 3, 2012

(54) METHOD FOR FORMING JUNCTIONS OF VERTICAL CELLS IN SEMICONDUCTOR DEVICE

(75) Inventor: Bo-Mi Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 13/025,586

(22) Filed: Feb. 11, 2011

(65) Prior Publication Data

US 2011/0269279 A1      Nov. 3, 2011

(30) Foreign Application Priority Data

Apr. 30, 2010   (KR) .................. 10-2010-0040901

(51) Int. Cl.
*H01L 21/8242*   (2006.01)

(52) U.S. Cl. ........ 438/270; 438/242; 438/246; 438/248; 438/259; 438/276; 438/389; 438/391; 438/561; 438/700; 438/701; 438/702; 438/703

(58) Field of Classification Search .................. None
See application file for complete search history.

(56) References Cited

U.S. PATENT DOCUMENTS

| 6,703,274 B1 * | 3/2004 | Chidambarrao et al. ...... 438/243 |
| 7,223,669 B2 * | 5/2007 | Cheng et al. .................. 438/386 |
| 2006/0134877 A1 | 6/2006 | Goebel et al. |

FOREIGN PATENT DOCUMENTS

| KR | 1019980082417 | 12/1998 |
| KR | 1020020010790 | 2/2002 |

OTHER PUBLICATIONS

Notice of Allowance issued by the Korean Intellectual Property Office on Jan. 31, 2012.

* cited by examiner

*Primary Examiner* — Charles Garber
*Assistant Examiner* — Yasser Abdelaziez
(74) *Attorney, Agent, or Firm* — IP & T Group LLP

(57) ABSTRACT

A method for fabricating a semiconductor device includes forming a plurality of active regions that are separated from each other by a plurality of trenches, respectively, wherein the trenches are formed by etching a substrate, forming an insulation layer having openings that each expose a portion of a first sidewall of each active region, forming a filling layer which fills the openings, forming a diffusion control layer over a substrate structure including the filling layer, and forming a junction on a portion of the first sidewall of each active region.

13 Claims, 12 Drawing Sheets

US 8,211,769 B2

METHOD FOR FORMING JUNCTIONS OF VERTICAL CELLS IN SEMICONDUCTOR DEVICE

CROSS-REFERENCE TO RELATED APPLICATIONS

The present application claims priority of Korean Patent Application No. 10-2010-0040901, filed on Apr. 30, 2010, which is incorporated herein by reference in its entirety.

BACKGROUND OF THE INVENTION

Exemplary embodiments of the present invention relate to a method for fabricating a semiconductor device, and more particularly, to a method for forming junctions of vertical cells in a semiconductor device.

As for a method for forming a junction by doping a region within a semiconductor device, an ion beam implantation method is widely used. The ion beam implantation method may be also referred to as a beam line implantation method.

As semiconductor devices are becoming highly integrated, more complicated vertical cells subject to $4F^2$ design rule have been produced, where F is a minimum feature size. However, doping a region through the ion beam implantation method are reaching limits. Vertical cells include pillar-type active regions each having sidewalls. The pillar-type active regions are also referred to as active pillars, where three-dimensional vertical cells are formed of the active pillars.

According to an example, selectively doping pillar-type active regions through the ion beam implantation method is performed at a certain angle. This is called a tilt ion implantation process.

FIG. 1 is a cross-sectional view illustrating a conventional method for forming junctions in a semiconductor device.

Referring to FIG. 1, a substrate 11 is etched using a hard mask layer 14 as an etch barrier to form pillar-type active regions 13 that are separated from each other by a trench 12.

Subsequently, an insulation layer 15 having an opening that exposes a portion of, for example, one sidewall of each pillar-type active region 13 is formed.

Since the gap between the pillar-type active regions 13 is narrow and the pillar-type active regions 13 are formed to have a certain height, a tilt ion implantation process 16 is applied during the doping process in order to form a junction 17 by doping a portion of a sidewall exposed through an opening.

The tilt ion implantation process 16 is to use a tilt angle. Therefore, some portions of a target region may not be doped due to a shadow effect 16A during the tilt ion implantation process 16. In other words, some portions of the target region may not be doped because they may be shadowed by adjacent pillar-type active regions 13.

Also, although the tilt ion implantation process 16 is used, it is difficult to form the junction 17 in a required doping concentration level and a required doping depth because the height of the pillar-type active regions 13 is high and the gap between the pillar-type active regions 13 is narrow.

SUMMARY OF THE INVENTION

An embodiment of the present invention is directed to a semiconductor device fabrication method that may easily control the doping concentration of a junction formed on a portion of a sidewall of a pillar-type active region and form the junction to be thin.

Another embodiment of the present invention is directed to a semiconductor device fabrication method that may prevent a dopant from being unnecessarily diffused into an area other than the region of a junction to be formed on a portion of a sidewall of each pillar-type active region 13.

In accordance with an embodiment of the present invention, a method for fabricating a semiconductor device includes: forming a plurality of active regions that are separated from each other by each of a plurality of trenches, respectively, wherein the trenches are formed by etching a substrate; forming an insulation layer having openings that each expose a portion of a first sidewall of each active region; forming a filling layer which fills the openings; forming a diffusion control layer over a substrate structure including the filling layer; and forming a junction on a portion of the first sidewall of each active region.

In accordance with another embodiment of the present invention, a method for fabricating a semiconductor device may include: forming a plurality of active regions that are separated from each other by a plurality of trenches, respectively, wherein the trenches are formed by etching a substrate; forming an insulation layer having openings that each expose a portion of a first sidewall of each active region; forming a filling layer that fills the openings; forming a doped layer that gap-fills the plurality of trenches over a substrate structure including the filling layer; and forming a junction on a portion of the first sidewall of each active region by performing an annealing process.

In accordance with yet another embodiment of the present invention, a method for fabricating a semiconductor device may include: forming a plurality of active regions that are separated from each other by a plurality of trenches, respectively, wherein the trenches are formed by etching a substrate; forming an insulation layer having openings that each expose a portion of a first sidewall of each active region; forming a diffusion control layer over a substrate structure including the insulation layer; forming a doped layer that gap-fills the plurality of trenches over the diffusion control layer; and performing an annealing process to form a junction on a portion of the first sidewall of each active region by diffusing dopants of the doped layer to the portion of the first sidewall through the diffusion control layer.

DESCRIPTION OF SPECIFIC EMBODIMENTS

Figure 1:
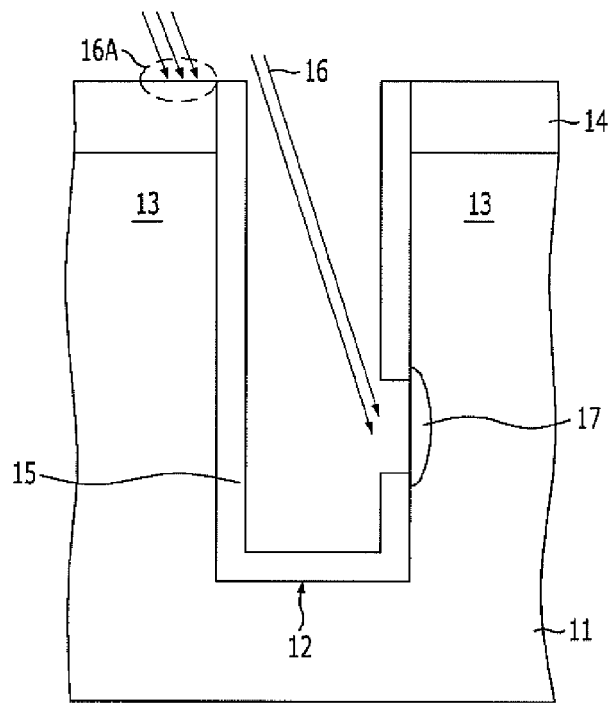
FIG. 1 is a cross-sectional view illustrating a conventional method for forming junctions in a semiconductor device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

FIGS. 2A to 2E are cross-sectional views illustrating a method for fabricating a semiconductor device in accordance with a first embodiment of the present invention.

Figure 2A:
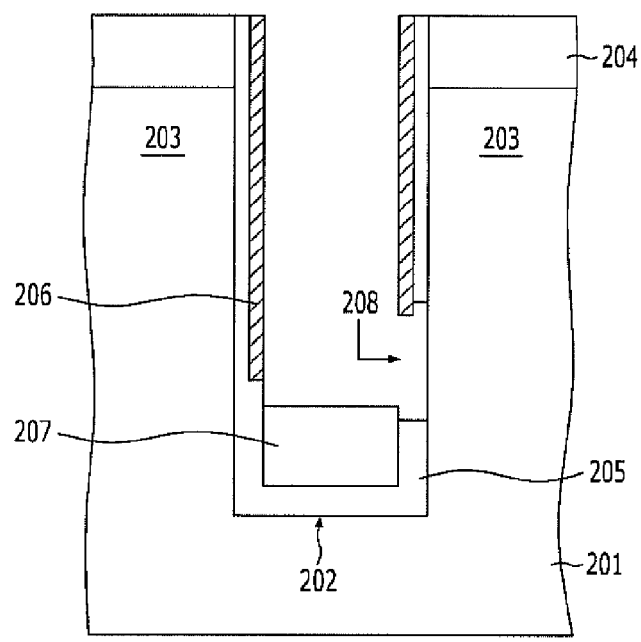
FIGS. 2A to 2E are cross-sectional views illustrating a method for fabricating a semiconductor device in accordance with a first embodiment of the present invention.

Referring to FIG. 2A, a plurality of active regions 203 are formed over a substrate 201. The plurality of active regions 203 are separated from each other by a trench 202. The substrate 201 includes a silicon substrate. The plurality of active regions 203 are formed by etching the substrate 201. Since the substrate 201 includes a silicon substrate, the plurality of active regions 203 is silicon according to an example. The plurality of active regions 203 extend perpendicularly to the surface of the substrate 201. The plurality of active regions 203 include pillars. The plurality of active regions 203 are areas where channel regions, source regions and drain regions of transistors are formed. The source regions and drain regions are also referred to as junctions. Each of the plurality of active regions 203 has a plurality of sidewalls. The plurality of active regions 203 include pillar-type active regions. The pillar-type active regions are referred to as "active pillars."

A hard mask layer 204 is formed over the plurality of active regions 203. The hard mask layer 204 functions as an etch barrier when the plurality of active regions 203 are formed. The hard mask layer 204 includes a dielectric layer such as an oxide layer or a nitride layer. In the embodiment of the present invention, a nitride layer is used as the hard mask layer 204. The hard mask layer 204 includes a silicon nitride layer.

An insulation layer is formed on both sidewalls of each active region 203, the surface of the substrate 201 between the plurality of active regions 203, and the surface of the hard mask layer 204. The insulation layer includes a liner oxide layer 205 and a liner nitride layer 206. The liner oxide layer 205 is formed on both sidewalls of each active region 203 and the surface of the substrate 201. The liner nitride layer 206 is formed on a portion of the surface of the liner oxide layer 205.

A sacrificial layer 207 filling a portion of each trench 202 is formed over the insulation layer. The sacrificial layer 207 includes an undoped polysilicon layer.

Subsequently, an opening 208 is formed by removing a portion of the insulation layer, where a low end of the opening is lower than a top surface of the insulation layer as shown. According to an example, the opening 208 has a One-Side-Opening (OSO) structure which selectively exposes a portion of one sidewall of each active region 203. The opening 208 includes a line-type opening. The opening 208 includes a bit line contact. The opening 208 is formed by removing a portion of the liner oxide layer 205 of the insulation layer, and a step height may be caused between the sacrificial layer 207 and the liner oxide layer 205.

The above-described insulation layer provides the opening 208 which exposes a portion of, for example, one sidewall of each active region 203. The method for forming the opening 208 is described later with reference to FIGS. 4A to 4K.

Figure 2B:
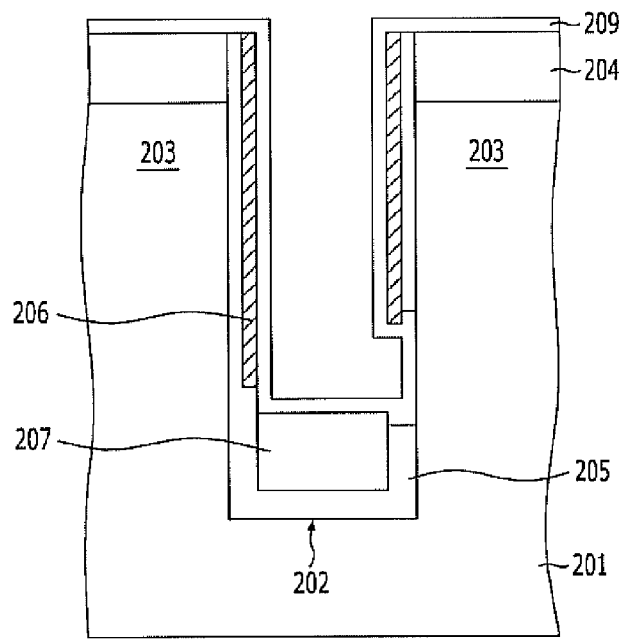

Referring to FIG. 2B, a diffusion control layer 209 is formed. The diffusion control layer 209 includes a metal layer. The diffusion control layer 209 includes a titanium (Ti) layer or a cobalt (Co) layer. The diffusion control layer 209 is formed through a Chemical Vapor Deposition (CVD) process, a Physical Vapor Deposition (PVD) process, or an Atomic Layer Deposition (ALD) process. The diffusion control layer 209 controls the diffusion of a dopant during a subsequent annealing process, and it is also used as a layer for forming an ohmic contact. The diffusion control layer 209 is formed in a thickness ranging from approximately 10 Å to approximately 100 Å. According to another embodiment, a silicide for an ohmic contact may be formed on the diffusion control layer 209 after the formation of the diffusion control layer 209.

Figure 2C:
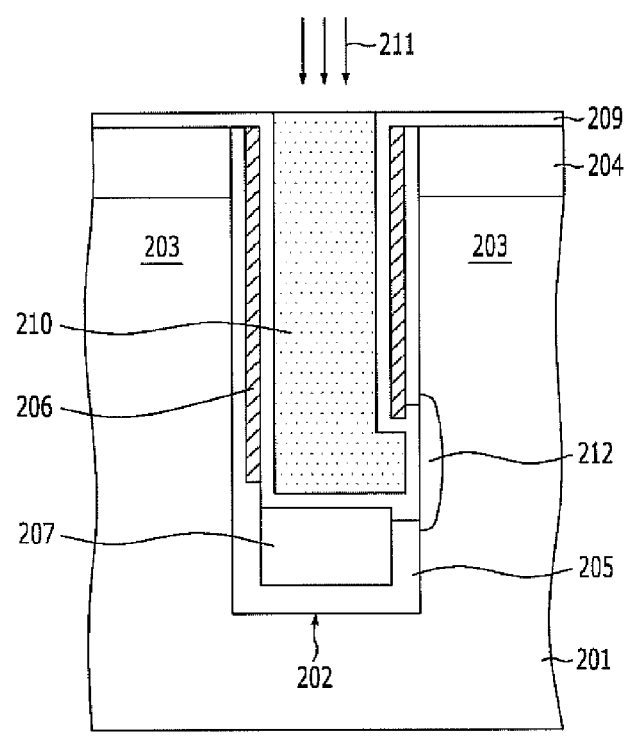

Referring to FIG. 2C, a doped layer 210 is formed over the diffusion control layer 209 to gap-fill the trench. Here, the doped layer 210 is doped with a dopant for forming a junction. For example, the doped layer 210 includes a doped polysilicon layer. Since the doped polysilicon layer has excellent step coverage characteristics, a void-free gap-filling may be formed on the trench 202 with the diffusion control layer 209 by using the doped polysilicon layer. Here, a junction to be formed subsequently has excellent dose uniformity. The dopant doping the doped layer 210 may include an N-type impurity such as phosphorus (P). The doped layer 210 may be formed through the CVD process to have a thickness ranging from approximately 500 Å to approximately 5000 Å. The dopant doping the doped layer 210 has a dopant dose of approximately $1 \times 10^{15}$ atoms/cm² to approximately $1 \times 10^{17}$ atoms/cm².

The doped layer 210 is planarized. As a result, the doped layer 210 gap-fills the trench 202.

Subsequently, an annealing process 211 is performed. Here, the dopant doping the doped layer 210 is diffused into a sidewall of each active region 203 which is exposed through the opening 208 (see FIG. 2A) to thereby form a junction 212. When the dopant doping the doped layer 210 is an N-type impurity, the junction 212 becomes an N-type junction.

The annealing process 211 may be a furnace annealing process, a Rapid Thermal Annealing (RTA), or a combination of the two. The annealing process 211 is performed at a temperature ranging from approximately 600° C. to approximately 1000° C. The junction 212 has a doping concentration of approximately $1 \times 10^{20}$ atoms/cm³ or higher.

As described above, since the junction 212 is formed by the formation of the doped layer 210 and the thermal diffusion through the annealing process 211, the junction 212 may be formed to have a shallow depth and the concentration of the dopant may be relatively easily controlled. The diffusion control layer 209 prevents the dopant from diffusing into the bottom of the trench 202 and an area other than the junction 212 during the annealing process 211.

Figure 2D:
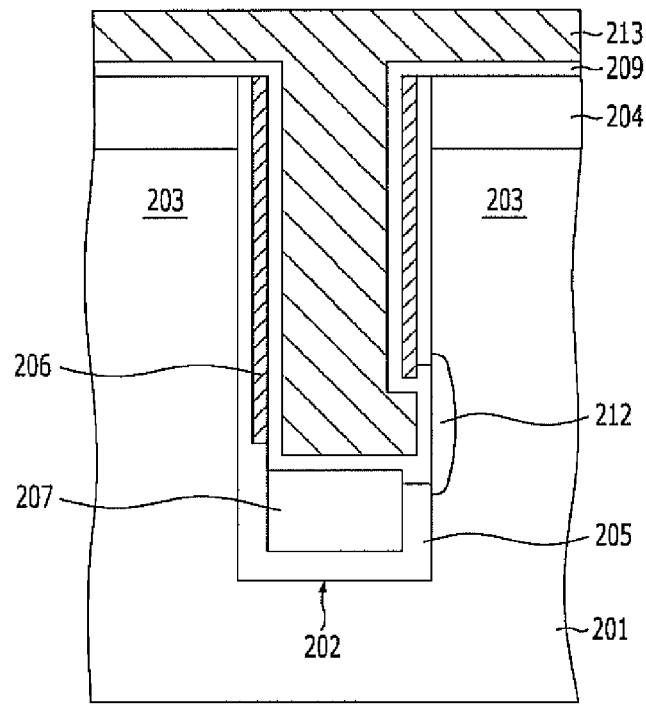

Referring to FIG. 2D, the doped layer 210 is removed. Here, the doped layer 210 may be removed through a wet etch process or a dry etch process. When the doped layer 210 is a doped polysilicon layer, the dry etch process is performed using a compound based on hydrogen bromide (HBr) or chlorine (Cl₂), and a vertical profile of the remaining structure is acquired by adding oxygen (O₂), nitrogen (N₂), Helium (He) or argon (Ar). When the wet etch process is performed, a cleaning solution having a high etching selectivity between a nitride layer and an oxide layer is used.

Subsequently, a bit line conductive layer 213 is formed. Here, the bit line conductive layer 213. Here, the bit line conductive layer 213 is formed over the substrate structure to gap-fill the space between the plurality of active regions 203. The bit line conductive layer 213 includes a metal layer, such as a titanium nitride (TiN) layer, a tungsten (W) layer, or a stack layer (TiN/W) of a titanium nitride (TiN) layer and a tungsten (W) layer. When the bit line conductive layer 213 is a metal layer, ohmic contact between the junction 212, which is formed of silicon, and the metal layer is used. The ohmic contact (not shown) is formed by performing a series of processes onto the diffusion control layer 209. The ohmic contact includes a metal silicide such as titanium silicide. To form the ohmic contact, the diffusion control layer 209 includes a titanium layer. According to one embodiment, the diffusion control layer 209 includes a stacked layer of a titanium layer and a titanium nitride layer. Subsequently, heat treatment is performed to thereby form a titanium silicide. The titanium layer used as the diffusion control layer 209 is formed through the CVD process to have a thickness ranging from approximately 10 Å to approximately 200 Å. The titanium nitride layer is formed through the CVD or ALD process to have a thickness ranging from approximately 10 Å to approximately 200 Å.

Figure 2E:
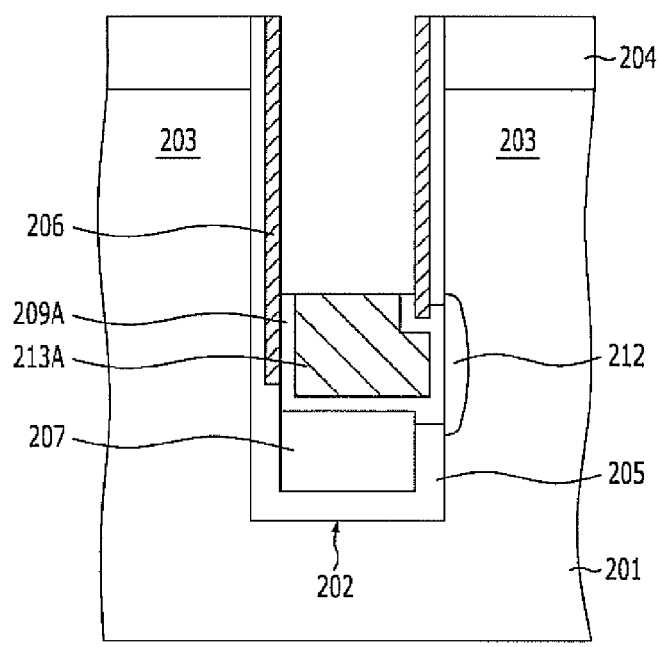

Referring to FIG. 2E, the bit line conductive layer 213 and the diffusion control layer 209 are removed to a height that maintains a contact with the junction 212. As a result, a buried bit line which is electrically connected to the junction 212 is formed. Here, the buried bit line includes a diffusion control layer pattern 209A and a bit line conductive layer pattern 213A.

FIGS. 3A to 3G are cross-sectional views illustrating a method for fabricating a semiconductor device in accordance with a second embodiment of the present invention.

Figure 3A:
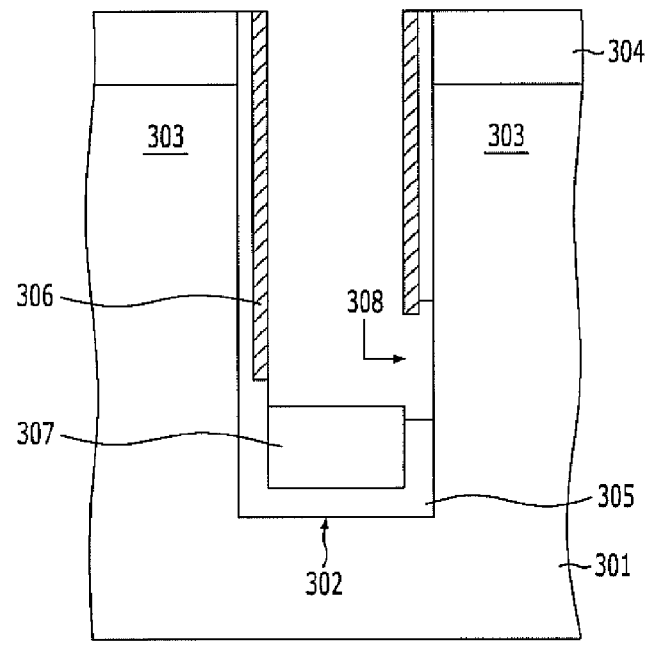
FIGS. 3A to 3G are cross-sectional views illustrating a method for fabricating a semiconductor device in accordance with a second embodiment of the present invention.

Referring to FIG. 3A, a plurality of active regions 303 are formed over a substrate 301. The plurality of active regions 303 are separated from each other by a trench 302. The substrate 301 includes a silicon substrate. The plurality of active regions 303 are formed by etching the substrate 301. Since the substrate 301 includes a silicon substrate, the plurality of active regions 303 include silicon according to an example. The plurality of active regions 303 extend perpendicularly to the surface of the substrate 301. The plurality of active regions 303 include pillars. The plurality of active regions 303 are the areas where channel regions, source regions and drain regions of transistors are formed. The source regions and drain regions are also referred to as junctions. Each of the plurality of active regions 303 has a plurality of sidewalls. The plurality of active regions 303 include pillar-type active regions. The pillar-type active regions are referred to as "active pillars."

A hard mask layer 304 is formed over the plurality of active regions 303. The hard mask layer 304 functions as an etch barrier when the plurality of active regions 303 are formed. The hard mask layer 304 includes a dielectric layer such as an oxide layer or a nitride layer. In the embodiment of the present invention, a nitride layer is used as the hard mask layer 304. The hard mask layer 304 includes a silicon nitride layer.

An insulation layer is formed on both sidewalls of each active region 303, the surface of the substrate 301 between the plurality of active regions 303, and the surface of the hard mask layer 304. The insulation layer includes a liner oxide layer 305 and a liner nitride layer 306. The liner oxide layer 305 is formed on both sidewalls of each active region 303 and the surface of the substrate 301. The liner nitride layer 306 is formed on a portion of the surface of the liner oxide layer 305.

A sacrificial layer 307 filling a portion of each trench 302 is formed over the insulation layer. The sacrificial layer 307 includes an undoped polysilicon layer.

Subsequently, an opening 308 is formed by removing a portion of the insulation layer. The opening 308 has a One-Side-Opening (OSO) structure which selectively exposes a portion of one sidewall of each active region 303. The opening 308 includes a line-type opening. The opening 308 includes a bit line contact. The opening 308 is formed by removing a portion of the liner oxide layer 305 of the insulation layer, and a step height may be caused between the sacrificial layer 307 and the liner oxide layer 305.

The above-described insulation layer provides the opening 308 which exposes a portion of one sidewall of each active region 303. The method for forming the opening 308 is described later with reference to FIGS. 4A to 4K.

Figure 3B:
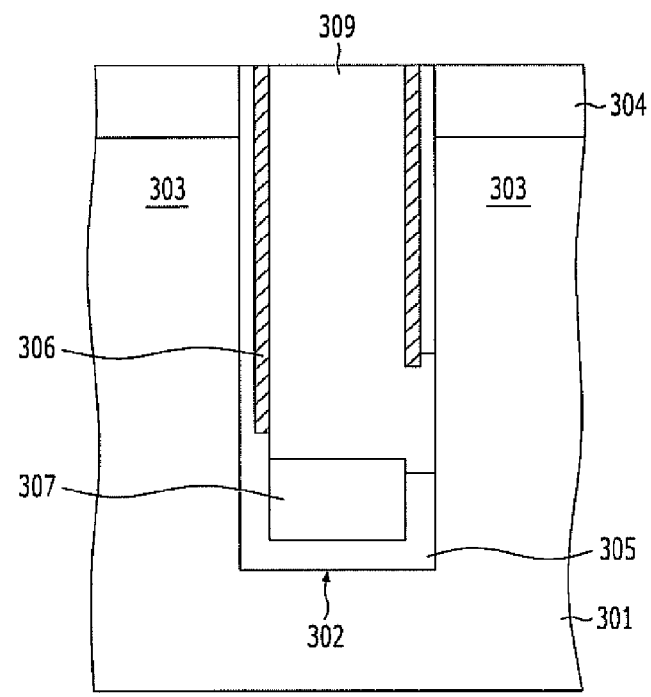

Referring to FIG. 3B, an undoped layer 309 gap-filling the trench 302 is formed. Here, the undoped layer 309 includes an undoped polysilicon layer. The undoped layer 309 is formed in a thickness ranging from approximately 500 Å to approximately 5000 Å.

The undoped layer 309 is planarized, and as a result, the undoped layer 309 gap-fills the trench 302.

Figure 3C:
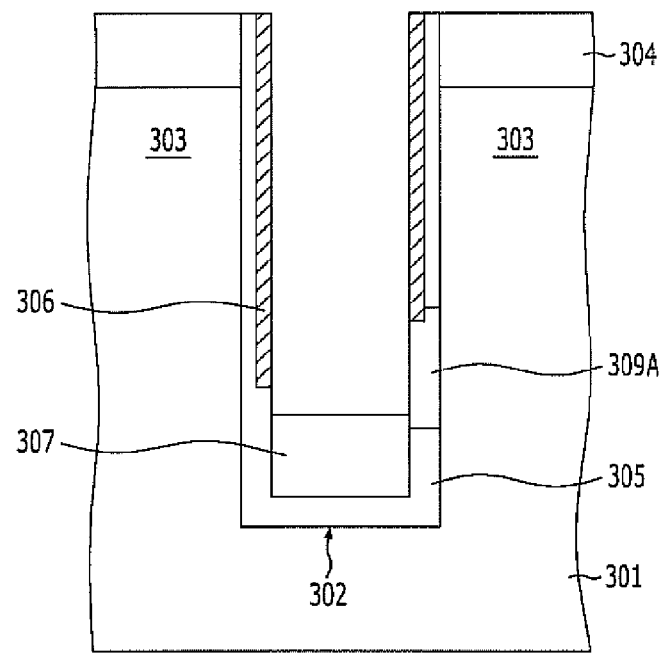

Referring to FIG. 3C, the opening is buried by selectively removing the undoped layer 309. As a result, a filling layer 309A which fills the opening is formed. The filling layer 309A is formed from the undoped layer 309. For example, an etch-back process may be performed to fill the opening with the filling layer 309A.

As described above, when the opening 308 is filled with the filling layer 309A, the step height between the sacrificial layer 307 and the liner oxide layer 305 is removed. As a result, the step coverage of a diffusion control layer which is to be formed later is improved.

According to an example, the filling layer 309A may be formed of a conductive material other than the undoped polysilicon.

Figure 3D:
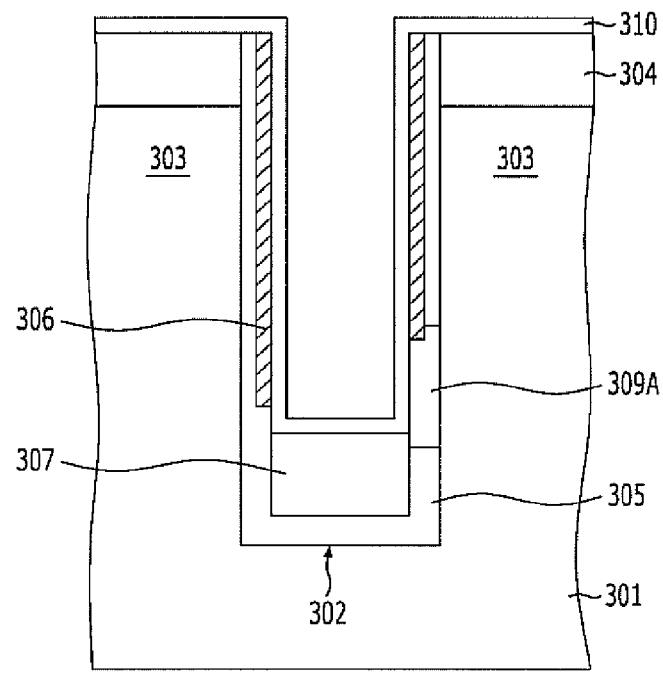

Referring to FIG. 3D, a diffusion control layer 310 is formed. The diffusion control layer 310 includes a metal layer. The diffusion control layer 310 includes a titanium (Ti) layer or a cobalt (Co) layer. The diffusion control layer 310 is formed through a Chemical Vapor Deposition (CVD) process, a Physical Vapor Deposition (PVD) process, or an Atomic Layer Deposition (ALD) process. The diffusion control layer 310 controls the diffusion of a dopant during a subsequent annealing process, and it is also used as a layer for forming an ohmic contact. The diffusion control layer 310 is formed in a thickness ranging from approximately 10 Å to approximately 100 Å. According to another embodiment, a silicide for an ohmic contact may be formed after the formation of the diffusion control layer 310.

Figure 3E:
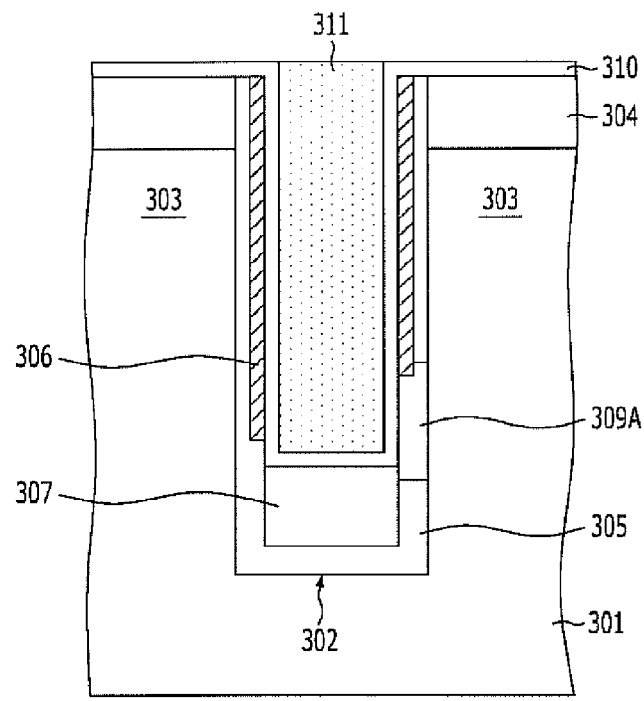

Referring to FIG. 3E, a doped layer 311 is formed over the diffusion control layer 310 to gap-fill the trench 302. Here, the doped layer 311 is doped with a dopant for forming a junction. For example, the doped layer 311 includes a doped polysilicon layer. Since the doped polysilicon layer has excellent step coverage characteristics, a void-free gap-filling may be formed on the trench 302 by using the doped polysilicon layer. Here, a junction to be formed subsequently has excellent dose uniformity. The dopant doping the doped layer 311 may include an N-type impurity such as phosphorus (P). The doped layer 311 may be formed through the CVD process to have a thickness ranging from approximately 50 Å to approximately 1000 Å. The dopant doping the doped layer 311 has a dopant dose of approximately $1 \times 10^{15}$ atoms/cm$^2$ to approximately $1 \times 10^{17}$ atoms/cm$^2$.

The doped layer 311 is planarized. As a result, the doped layer 311 gap-fills the trench 302.

Figure 3F:
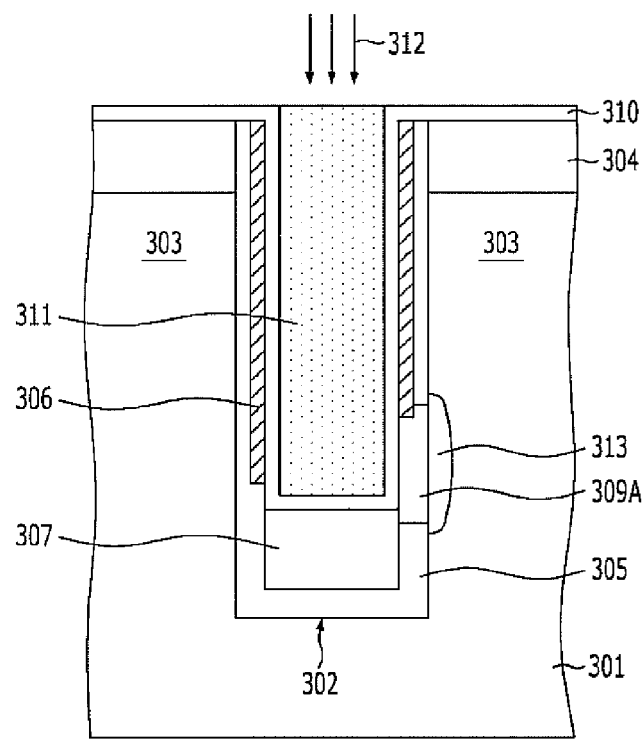

Referring to FIG. 3F, an annealing process 312 is performed. Here, the dopant doping the doped layer 311 is diffused into one sidewall of each active region 303 to thereby form a junction 313. When the dopant doping the doped layer 311 is an N-type impurity, the junction 313 becomes an N-type junction. The annealing process 312 may be a furnace annealing process, a Rapid Thermal Annealing (RTA), or a combination of the two. The annealing process 312 is performed at a temperature ranging from approximately 750° C. to approximately 1200° C. The junction 313 has a doping concentration of approximately $1 \times 10^{20}$ atoms/cm$^3$ or higher.

As described above, since the junction 313 is formed by the formation of the doped layer 311 and the thermal diffusion through the annealing process 312, the junction 313 may be formed to have a shallow depth and the concentration of the dopant may be controlled relatively easily. In particular, a shallow junction may be formed by performing a control to make the depth of the 313 to be even more shallow. For example, when there is no diffusion control layer 310, the junction 313 may be excessively diffused on the sides, and accordingly, a floating body effect may occur. The filling layer 309A may be doped during the annealing process 312, but since the filling layer 309A is a conductive material, it provides an electrical connection between a buried bit line, which is to be formed later, and the junction 313.

Figure 3G:
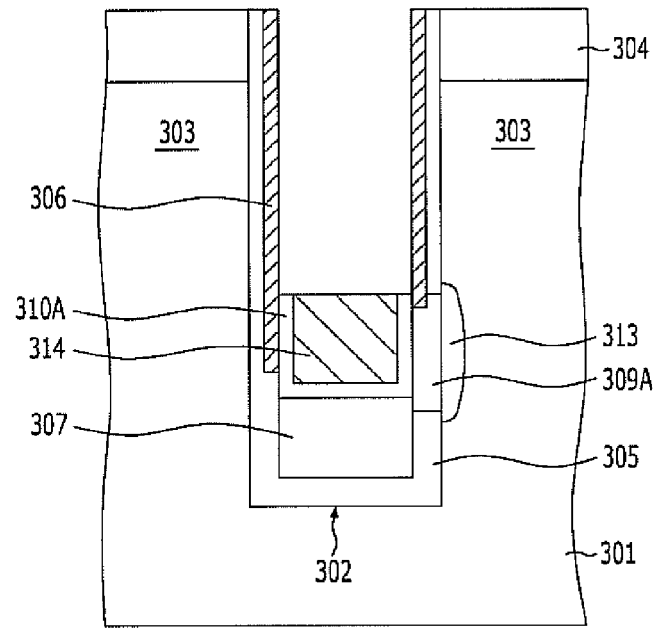

Referring to FIG. 3G, the doped layer 311 is removed. Here, the doped layer 311 may be removed through a wet etch process or a dry etch process. When the doped layer 311 is a doped polysilicon layer, the dry etch process is performed using a compound based on hydrogen bromide (HBr) or chlorine (Cl$_2$), and a vertical profile is acquired by adding oxygen (O$_2$), nitrogen (N$_2$), Helium (He) or argon (Ar). When the wet etch process is performed, a cleaning solution having a high etching selectivity between a nitride layer and an oxide layer is used.

Subsequently, a buried bit line which is electrically connected to the junction 313 is formed. Here, the buried bit line includes a diffusion control layer pattern 310A and a bit line conductive layer 314. Here, the bit line conductive layer 314 is formed over the substrate structure to gap-fill the space between the plurality of active regions 303. The bit line conductive layer 314 includes a metal layer such as a titanium nitride (TiN) layer, a tungsten (W) layer, or a stack layer (TiN/W) of a titanium nitride (TiN) layer and a tungsten (W) layer. When the bit line conductive layer 314 is a metal layer, an ohmic contact between the junction 313 formed of silicon and the metal is layer is used. The ohmic contact (not shown) is formed by performing a series of processes on the diffusion control layer 310. According to an example, the ohmic contact includes a metal silicide such as titanium silicide. To form the ohmic contact, the diffusion control layer 310 includes a titanium layer. According to one embodiment, the diffusion control layer 310 includes a stacked layer of a titanium layer and a titanium nitride layer. Subsequently, heat treatment is performed to thereby form a titanium silicide. The titanium layer used as the diffusion control layer 310 is formed through the CVD process to have a thickness ranging from approximately 10 Å to approximately 200 Å. The titanium nitride layer is formed through the CVD or ALD process to have a thickness ranging from approximately 10 Å to approximately 200 Å. Subsequently, the bit line conductive layer 314 and the diffusion control layer 310 are removed to a height that maintains a contact with the junction 313. Here, an etch-back process is performed. As a result, a buried bit line which is electrically connected to the junction 313 is formed. Here, the buried bit line includes a diffusion control layer pattern 310A and a bit line conductive layer pattern 314A.

FIGS. 4A to 4K are cross-sectional views illustrating a method for forming an opening in accordance with the first and second embodiments of the present invention.

Figure 4A:
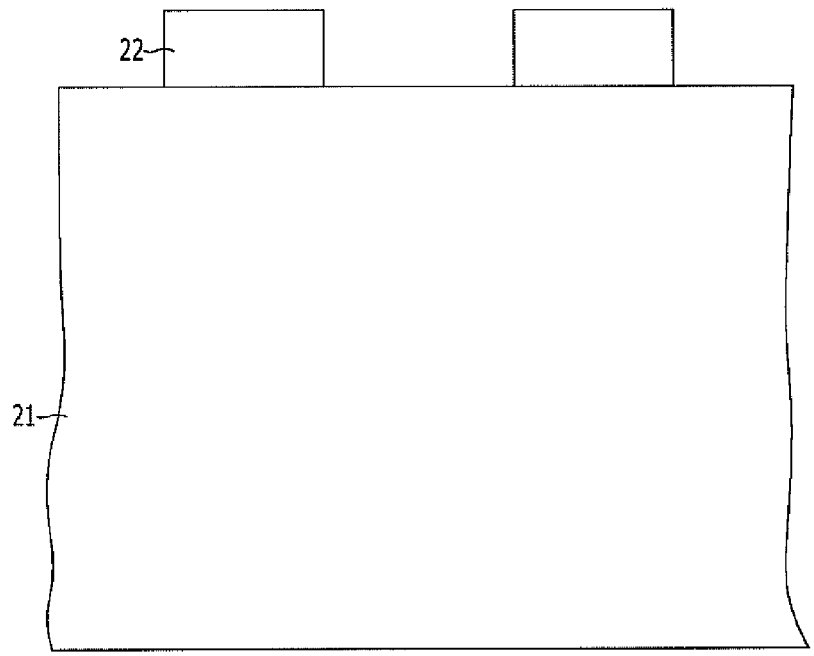
FIGS. 4A to 4K are cross-sectional views illustrating a method for forming an opening in accordance with the first and second embodiments of the present invention.

Referring to FIG. 4A, a hard mask layer 22 is formed over a substrate 21. The substrate 21 includes a silicon substrate. The hard mask layer 22 includes a nitride layer. Also, the hard mask layer 22 may have a multi-layer structure which includes an oxide layer and a nitride layer. For example, the hard mask layer 22 may include a hard mask nitride layer and a hard mask oxide layer that are sequentially stacked. Also, the hard mask layer 22 may include a hard mask nitride layer, a hard mask oxide layer, a hard mask silicon oxynitride (SiON) layer, and a hard mask carbon layer that are sequentially stacked. When the hard mask layer 22 includes a hard mask nitride layer, a pad oxide layer may be additionally formed between the substrate 21 and the hard mask layer 22. The hard mask layer 22 is formed using a photoresist pattern, which is not shown in the drawing.

Figure 4B:
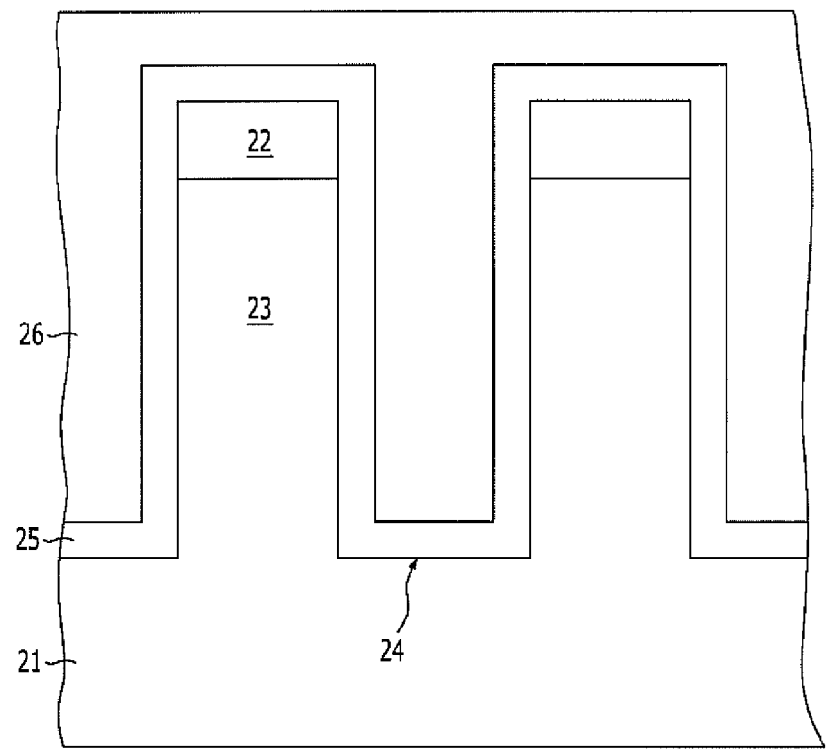

Referring to FIG. 4B, a trench etch process is performed using the hard mask layer 22 as an etch barrier. For example, active regions 23 are formed by etching the substrate 21 to a desired depth by using the hard mask layer 22 as an etch barrier. The active regions 23 are separated from each other by respective trenches 24. The active regions 23 include the regions where transistors are formed. Each active region 23 includes two sidewalls. The trench etch process includes an anisotropic etch process. When the substrate 21 is a silicon substrate, the anisotropic etch process may include a plasma dry etch process which uses chlorine (Cl$_2$) or hydrogen bromide (HBr) alone or a gas mixture of both. The formation of the trenches 24 results in the active regions 23 formed over the substrate 21. The active regions 23 may be line-type pillars such as line-type active pillars, where the active pillars refer to pillar-type active regions.

A liner oxide layer 25 is formed as an insulation layer. The liner oxide layer 25 includes an oxide layer such as a silicon oxide layer.

Subsequently, a first gap-fill layer 26 gap-filling the trenches 24 between the active regions 23 is formed. The first gap-fill layer 26 includes an undoped polysilicon layer or an amorphous silicon layer.

Figure 4C:
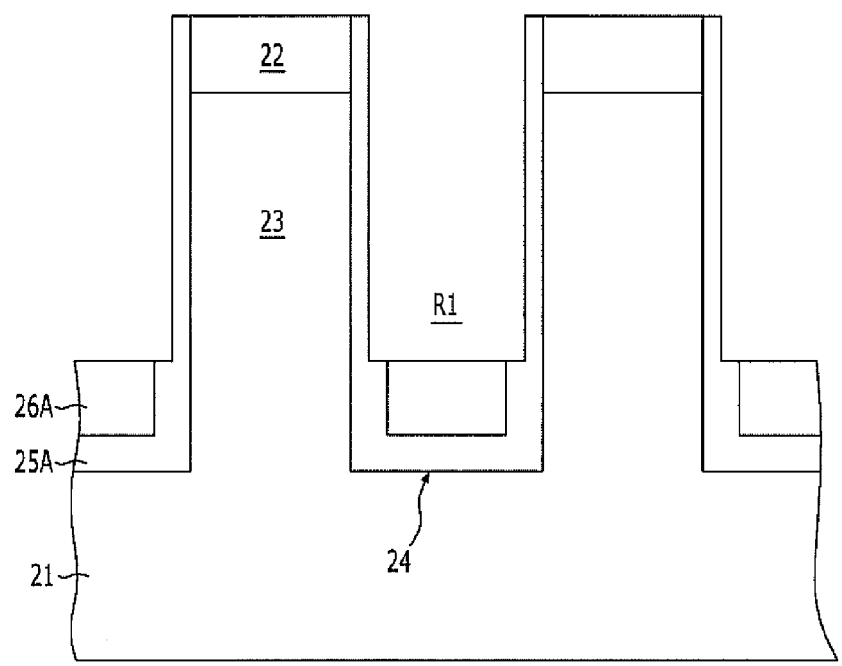

Referring to FIG. 4C, the first gap-fill layer 26 is planarized until the surface of the hard mask layer 22 is exposed. The planarized first gap-fill layer 26 is referred to as a first gap-fill layer pattern 26A hereafter. The planarization of the first gap-fill layer 26 includes a Chemical Mechanical Polishing (CMP) process. Subsequently, an etch-back process is performed. After the etch-back process, the first gap-fill layer pattern 26A provides a first recess R1. During the CMP process, the liner oxide layer 25 over the hard mask layer 22 may be polished. As a result, a liner oxide layer pattern 25A which covers both sidewalls of the hard mask layer 22 and the trench 24 is formed. The liner oxide layer pattern 25A covers the bottom of the trench 24 as well.

Subsequently, a portion of the liner oxide layer pattern 25A goes through a thinning process.

Figure 4D:
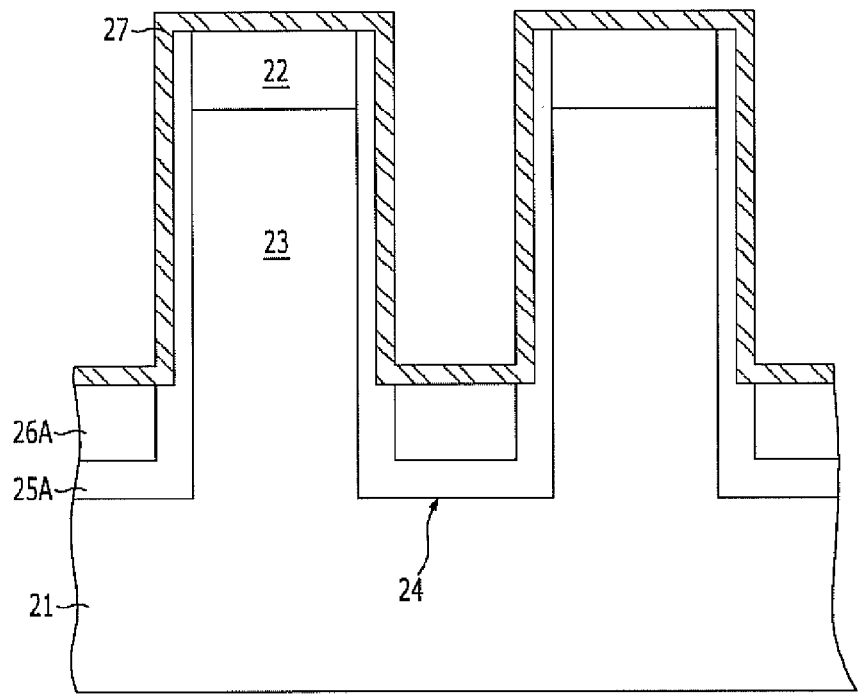

Referring to FIG. 4D, a liner nitride layer 27 is formed as an insulation over the substrate structure including the first gap-fill layer pattern 26A. The liner nitride layer 27 includes a nitride layer such as a silicon nitride layer.

Figure 4E:
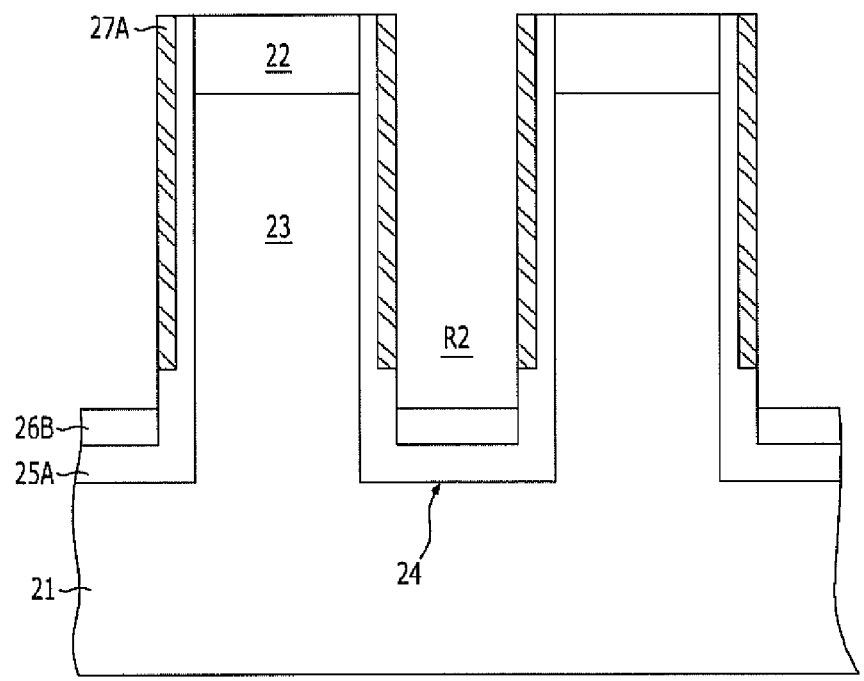

Referring to FIG. 4E, the liner nitride layer 27 is etched. As a result, a liner nitride layer pattern 27A is formed. The liner nitride layer pattern 27A has a form of spacers formed on a thinned area of the liner oxide layer pattern 25A.

Subsequently, the first gap-fill layer pattern 26A is recessed to a desired depth by using the liner nitride layer pattern 27A as an etch barrier. As a result, a second recess R2 is formed. The first gap-fill layer pattern 26A with the second recess R2 formed therein is referred to as a recessed first gap-fill layer pattern 26B, hereafter.

Figure 4F:
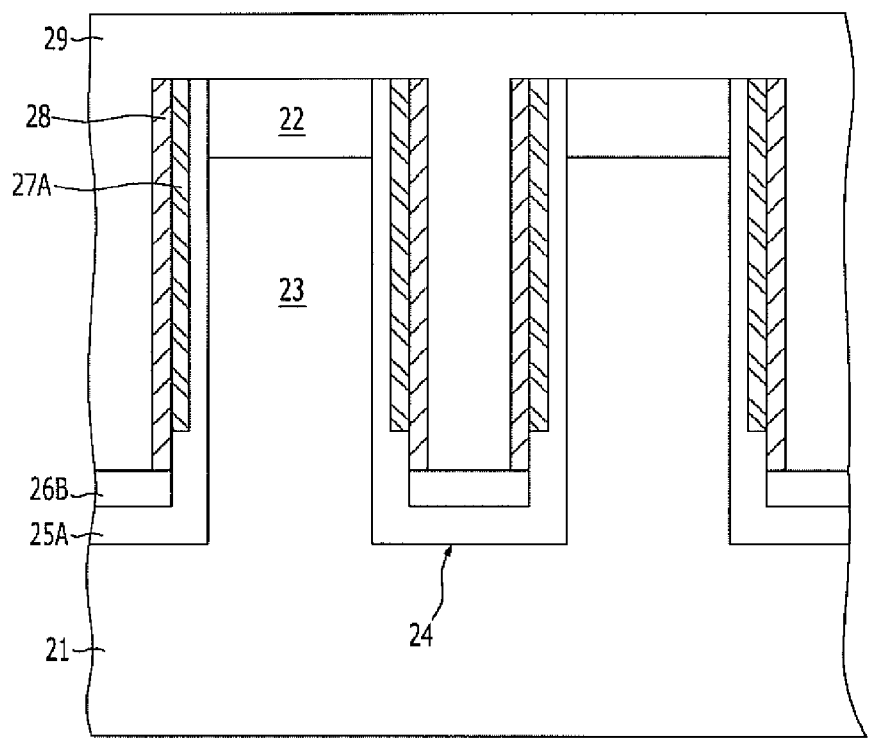

Referring to FIG. 4F, a metal nitride layer is conformally formed over the substrate structure including the second recess R2. Subsequently, a spacer etch process is performed to form spacers 28. The spacers 28 are formed on both sides of each active region 23. The spacers 28 include a titanium nitride (TiN) layer.

Subsequently, a second gap-fill layer 29 is formed to gap-fill the second recess R2 where the spacers 28 are formed. The second gap-fill layer 29 includes an oxide layer. The second gap-fill layer 29 includes a Spin-On Dielectric (SOD) layer.

Figure 4G:
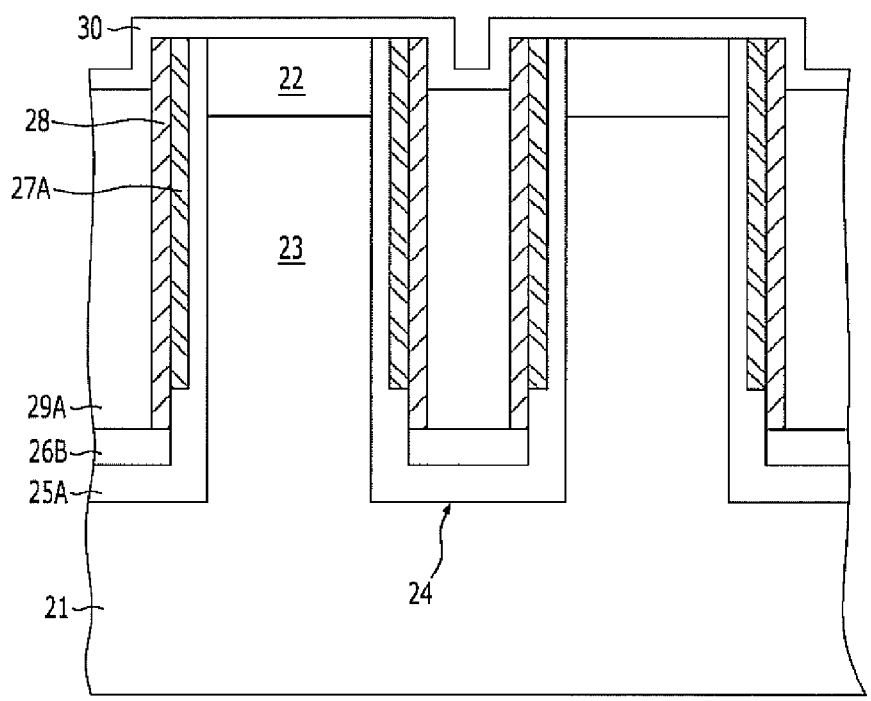

Referring to FIG. 4G, the second gap-fill layer 29 is planarized and then an etch-back process is performed. As a result, a recessed second gap-fill layer pattern 29A is formed.

Subsequently, an etch barrier 30 is formed over the substrate structure including the recessed second gap-fill layer pattern 29A. The etch barrier 30 includes an undoped polysilicon layer.

Figure 4H:
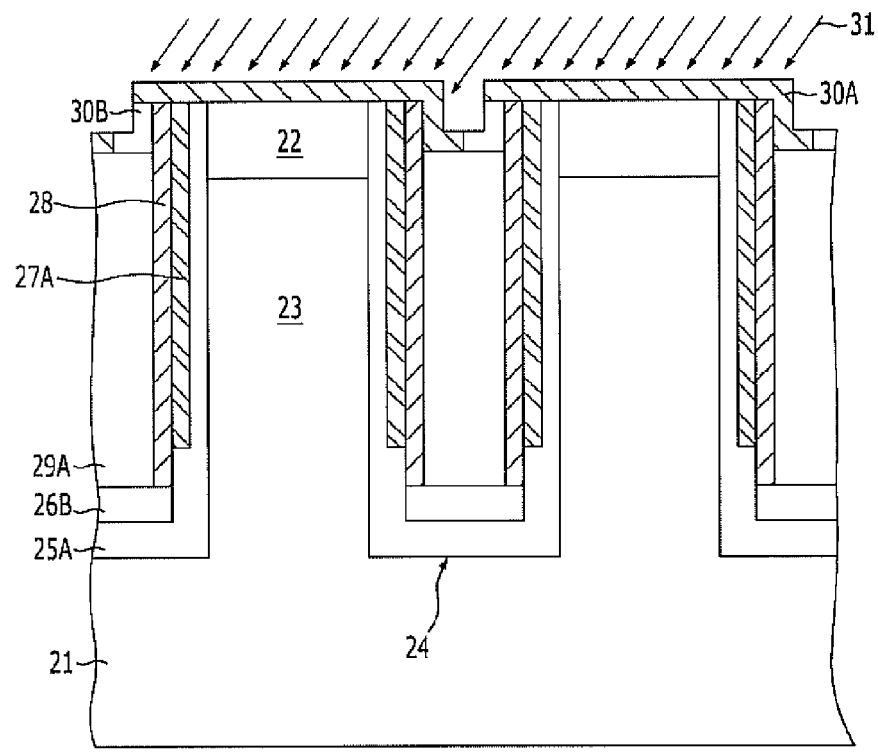

Referring to FIG. 4H, a tilt ion implantation process 31 is performed.

The tilt ion implantation 31 is a process of implanting ions of a dopant at a desired angle. The dopant is implanted to a portion of the etch barrier 30.

The tilt ion implantation process 31 is performed at a desired angle. The desired angle ranges from approximately 5° to approximately 30°. Ion beam is partly blocked by the hard mask layer 22 to create a shadowed area. Therefore, a portion of the etch barrier 30 is doped with the dopant but the other portion of the etch barrier 30 remains undoped. The ion-implanted dopant may be a P-type dopant, e.g., boron, and a dopant source for ion-implanting the boron may be $BF_2$. As a result, a portion of the etch barrier 30 remains undoped, and the undoped portion of the etch barrier 30 is adjacent to the left side of the hard mask layer 22.

As a result of the tilt ion implantation process 31, a portion of the etch barrier 30 over the hard mask layer 22 and a portion adjacent to the right side of the hard mask layer 22 become doped etch barrier 30A doped with the dopant. The portion of the etch barrier 30 that is not doped with the dopant on the left side of the hard mask layer 22 becomes an undoped doped etch barrier 30B.

Figure 4I:
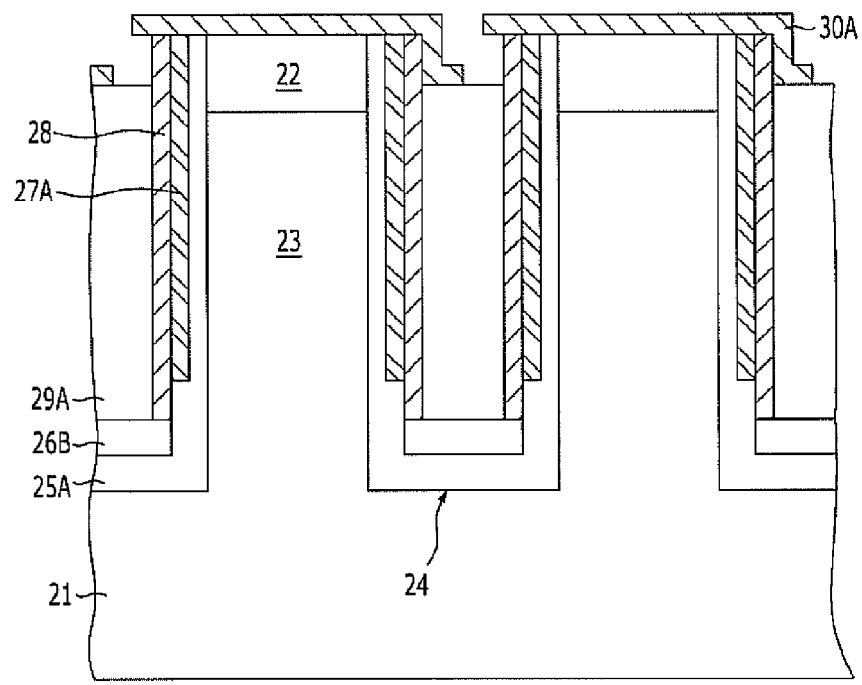

Referring to FIG. 4I, the undoped doped etch barrier 30B is removed. Here, the polysilicon layer that is used as the etch barrier is etched at different etch rates according to whether it is doped with the dopant or not. More specifically, the undoped polysilicon layer which is not doped with the dopant is wet-etched fast. Therefore, the undoped polysilicon layer is selectively removed by using a chemical having an etching selectivity where, for example, only the undoped polysilicon is wet-etched. The undoped doped etch barrier 30B is removed through a wet-etch process or a wet cleaning process.

After the undoped doped etch barrier 30B is removed through the above-described process, the doped etch barrier 30A remains.

Figure 4J:
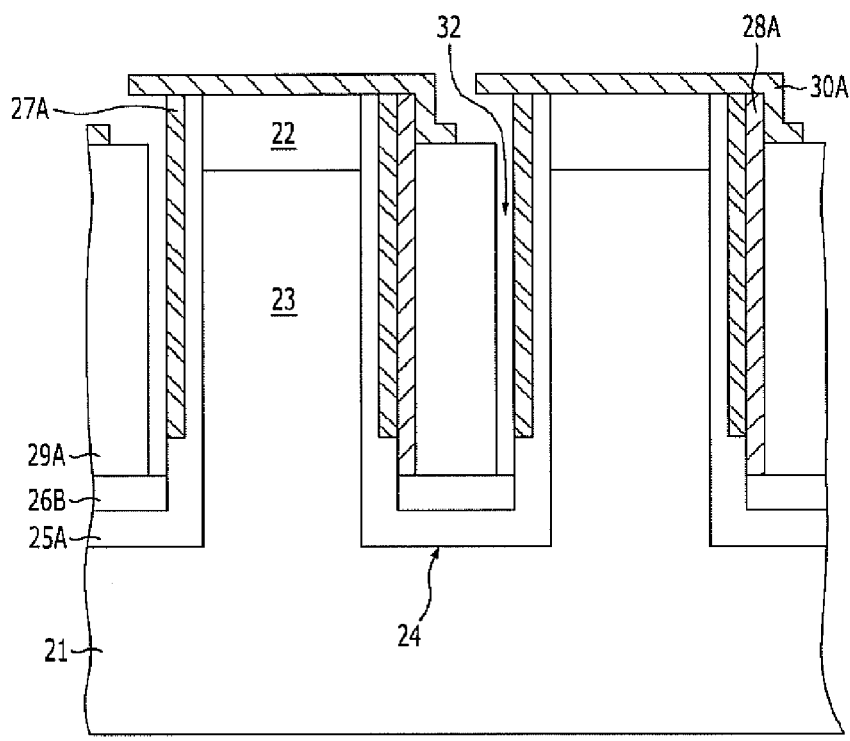

Referring to FIG. 4J, one of the spacers 28 of each trench 24 is removed. As a result, a first gap 32 is formed. The spacer 28 is removed through a wet-etch process. As a result, one spacer 28 remains. The remaining spacer is referred to as a first second spacer 28A, hereafter.

Figure 4K:
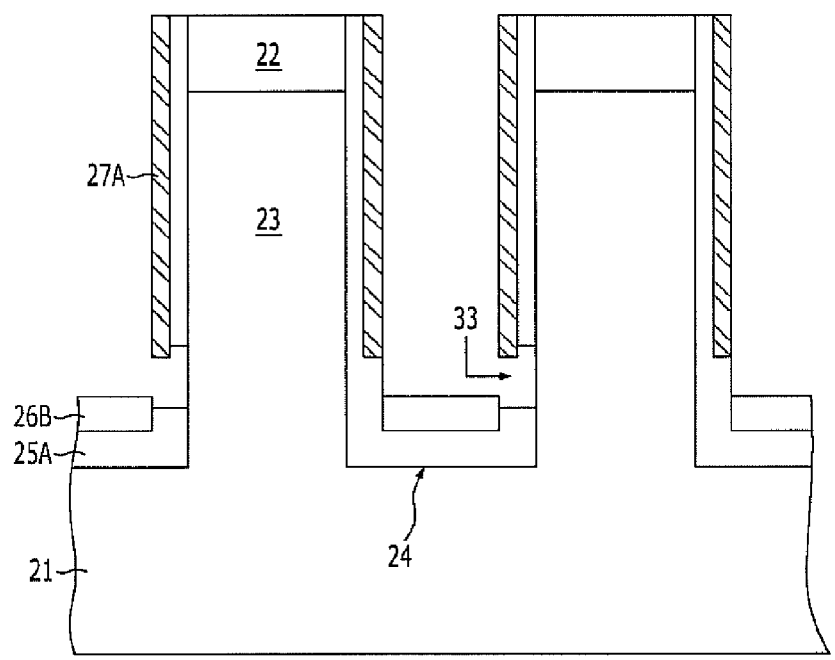

Referring to FIG. 4K, a cleaning process is performed to expose a portion of one sidewall of each active region 23.

The cleaning process includes a wet cleaning process. The wet cleaning process is performed using hydrogen fluoride (HF) and a buffered oxide etchant (BOE). Through the wet cleaning process, a portion of the liner oxide layer pattern 25A is removed and as a result an opening 33 is formed. The recessed second gap-fill layer pattern 29A is removed as well as the liner oxide layer pattern 25A.

As described above, the hard mask layer 22, the liner oxide layer pattern 25A, and the liner nitride layer pattern 27A are collectively referred to as the insulation layer. Therefore, the insulation layer provides the opening 33 which exposes a portion of any one sidewall of each active region 23.

Subsequently, the doped etch barrier 30A and the first second spacer 28A are removed.

The opening 33 corresponds to the opening 208 in the first embodiment and the opening 308 in the second embodiment. Also, the liner oxide layer pattern 25A corresponds to the liner oxide layer 205 in the first embodiment and the liner oxide layer 305 in the second embodiment. The liner nitride layer pattern 27A corresponds to the liner nitride layer 206 in the first embodiment and the liner nitride layer 306 in the second embodiment. The active regions 23 correspond to the active regions 203 in the first embodiment and the active regions 303 in the second embodiment.

The second embodiment of the present invention, which is described above, may enable the depth of the junctions to be shallower and more uniform than the first embodiment during an annealing process, which is performed for forming the junctions subsequently, by filling the opening 308 with the filling layer 309A to remove the step height difference of the opening 308 caused by the sacrificial layer 307.

According to an exemplary embodiment of the present invention, which is described above, may improve the step coverage characteristics of a diffusion control layer, which is formed after the formation of a filling layer, by forming the filling layer for filling the openings of an insulation layer.

Also, an exemplary embodiment of the present invention may enable the depth of junctions to be shallow by forming a diffusion control layer and a filling layer.

Since the technology of the present invention may easily control the depth and a dopant dose of the junctions in the course of forming three-dimensional vertical cells, reliable vertical cells may be formed.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:
    forming a plurality of active regions that are separated from each other by a plurality of trenches, respectively, wherein the trenches are formed by etching a substrate;
    forming an insulation layer having openings that each expose a portion of a first sidewall of each active region;
    forming a filling layer which fills the openings;
    forming a diffusion control layer over a substrate structure including the filling layer; and
    forming a junction on a portion of the first sidewall of each active region.

2. The method of claim 1, wherein the forming of the filling layer comprises:
    forming a conductive layer that gap-fills the plurality of trenches over the insulation layer; and
    performing a planarization process and an etch-back process on the conductive layer.

3. The method of claim 1, wherein the filling layer comprises an undoped polysilicon layer.

4. The method of claim 1, wherein the forming of the junction comprises:
    forming a doped layer that gap-fills the plurality of trenches over the diffusion control layer; and
    performing an annealing process.

5. The method of claim 4, wherein the doped layer comprises a doped polysilicon layer doped with phosphorus (P) or arsenic (As).

6. The method of claim 1, wherein the diffusion control layer comprises a metal layer.

7. The method of claim 1, wherein the diffusion control layer comprises a titanium layer or a cobalt layer.

8. The method of claim 1, wherein the diffusion control layer is formed through a Chemical Vapor Deposition (CVD) process, a Physical Vapor Deposition (PVD) process, or an Atomic Layer Deposition (ALD) process.

9. The method of claim 1, further comprising:
forming a bit line that is coupled with the junction and fills a portion of each trench after the forming of the junction.

10. The method of claim 9, wherein the forming of the bit line comprises:
forming a bit line conductive layer that gap-fills each of the plurality of trenches over the diffusion control layer; and
removing the bit line conductive layer and the diffusion control layer to a depth that maintains a contact with the junction.

11. A method for fabricating a semiconductor device, comprising:
forming a plurality of active regions that are separated from each other by a plurality of trenches, respectively, wherein the trenches are formed by etching a substrate;
forming an insulation layer having openings that each expose a portion of a first sidewall of each active region;
forming a diffusion control layer over a substrate structure including the insulation layer;
forming a doped layer that gap-fills the plurality of trenches over the diffusion control layer; and
performing an annealing process to form a junction on a portion of the first sidewall of each active region by diffusing dopants of the doped layer to the portion of the first sidewall through the diffusion control layer.

12. The method of claim 11, further comprising:
forming a sacrificial layer on the insulation layer; and
etching the insulation layer to have a low end thereof lower than a top surface of the sacrificial layer in height.

13. The method of claim 11, wherein the diffusion control layer is formed directly on the substrate structure including the insulation layer but without an intervening filling layer.

* * * * *